(12) United States Patent
Wu

(10) Patent No.: US 8,432,745 B2
(45) Date of Patent: Apr. 30, 2013

(54) HIGH SECOND BIT OPERATION WINDOW METHOD FOR VIRTUAL GROUND ARRAY WITH TWO-BIT MEMORY CELLS

(75) Inventor: Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/184,189

(22) Filed: Jul. 15, 2011

(65) Prior Publication Data
US 2011/0267889 A1 Nov. 3, 2011

Related U.S. Application Data

(63) Continuation of application No. 12/233,904, filed on Sep. 19, 2008, now Pat. No. 7,986,564.

(51) Int. Cl.
*G11C 16/00* (2006.01)

(52) U.S. Cl.
USPC ............. 365/185.29; 365/185.16; 365/185.18

(58) Field of Classification Search ........................ None
See application file for complete search history.

(56) References Cited

U.S. PATENT DOCUMENTS

| | | | |
|---|---|---|---|
| 6,674,667 B2 * | 1/2004 | Forbes ...................... | 365/185.24 |
| 6,690,601 B2 * | 2/2004 | Yeh et al. .................. | 365/185.28 |
| 7,075,828 B2 * | 7/2006 | Lue et al. .................. | 365/185.24 |
| 7,133,316 B2 * | 11/2006 | Lue ............................ | 365/185.28 |
| 7,471,568 B2 * | 12/2008 | Wu ............................ | 365/185.24 |
| 7,535,771 B2 * | 5/2009 | Hsieh et al. ............... | 365/185.29 |
| 7,684,252 B2 * | 3/2010 | Wu ............................ | 365/185.25 |
| 7,787,294 B2 * | 8/2010 | Kuo et al. .................. | 365/185.03 |
| 7,791,954 B2 * | 9/2010 | Parker ....................... | 365/185.29 |
| 2007/0297241 A1 * | 12/2007 | Wu ............................ | 365/185.25 |

* cited by examiner

*Primary Examiner* — Tan T. Nguyen
(74) *Attorney, Agent, or Firm* — J.C. Patents

(57) ABSTRACT

A non-volatile VG memory array employing memory semiconductor cells capable of storing two bits of information having a non-conducting charge trapping dielectric, such as silicon nitride, layered in associating with at least one electrical insulating layer, such as an oxide, is disclosed. Bit lines of the memory array are capable of transmitting positive voltage to reach the source/drain regions of the memory cells of the array. A method that includes the hole injection erasure of the memory cells of the array that lowers the voltage threshold of the memory cells to a value lower than the initial voltage threshold of the cells is disclosed. The hole injection induced lower voltage threshold reduces the second bit effect such that the window of operation between the programmed and un-programmed voltage thresholds of the bits is widened. The programming and read steps reduce leakage current of the memory cells in the array.

1 Claim, 15 Drawing Sheets

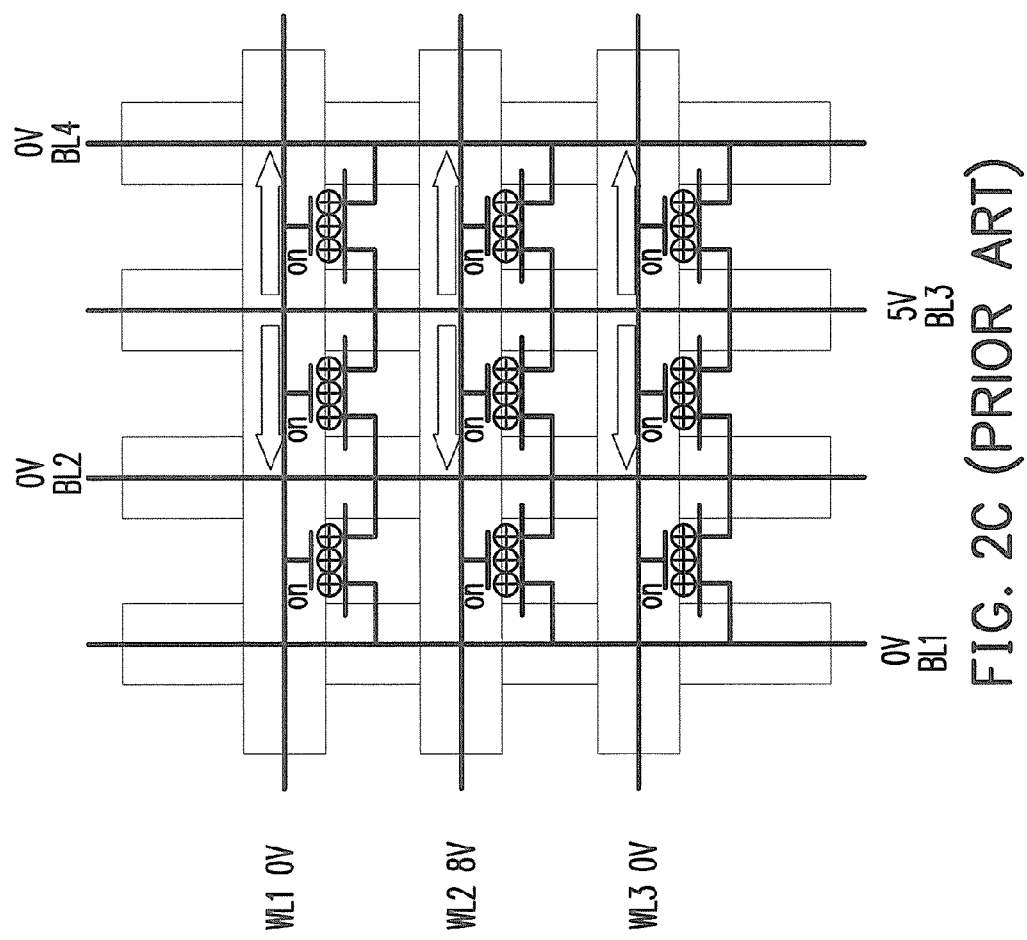

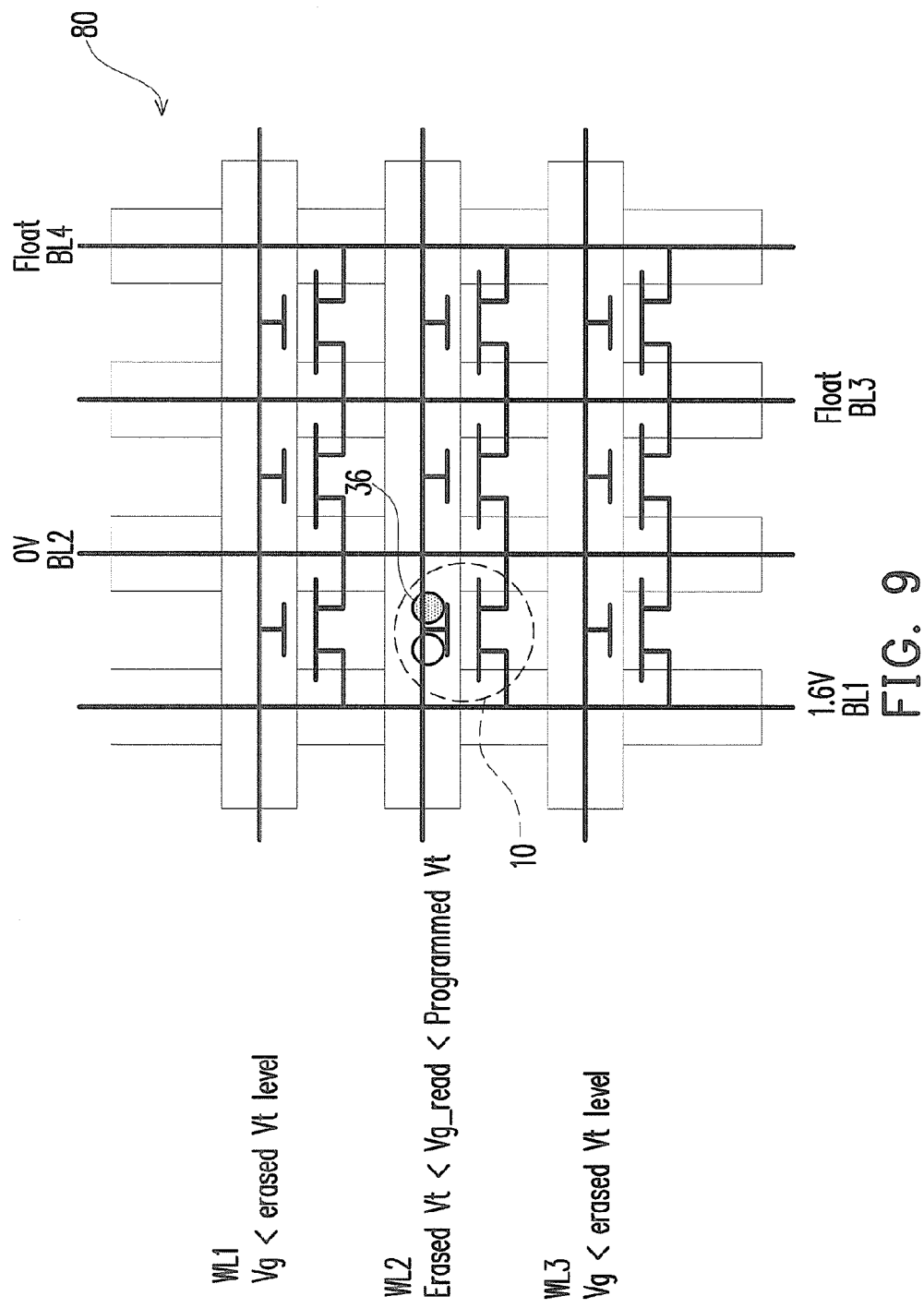

HIGH SECOND BIT OPERATION WINDOW METHOD FOR VIRTUAL GROUND ARRAY WITH TWO-BIT MEMORY CELLS

CROSS-REFERENCE TO RELATED APPLICATION

This application is a continuation application of and claims priority benefit of the application Ser. No. 12/233,904, filed on Sep. 19, 2008 now U.S. Pat. No. 7,986,564, now allowed. The entirety of the above-mentioned patent application is hereby incorporated by reference herein and made a part of this specification.

BACKGROUND OF THE INVENTION

The present invention relates to non-volatile flash memory ("NVM") semiconductor device which is able to continually store information even when the supply of electricity is removed from the device containing the NVM cell. More particularly, the invention relates to a NVM semiconductor device having two-bits per cell employed in a virtual ground (VG) array. Also, the invention relates to a method for programming the two-bits per cell NVM semiconductor in the VG array. This innovation provides for a more capable VG array due to the doubled memory density per cell, which is also known as multi-level flash memory. The invention also impacts an NVM semiconductor device "window of operation" that permits more effective use of two-bits per cell NVM semiconductor devices. The invention also addresses the leakage current issue experienced with VG arrays when some erasing, programming, and reading methods are applied.

Multi-level, or multi-bit, flash memory cells provide a solution for increasing the amount of data that can be stored on a memory device without consuming more space. Whereas a single-bit cell can store only two states, "on" and "off" (typically labeled "0" and "1"), a cell having n bits and using binary encoding is capable of storing up 2n states. Thus, a two-bit cell may store data in four discrete states, "00", "01", "10" and "11" which is distinctly more efficient that the "0" or "1" state alone. FIG. 1A shows a typical two-bit cell, generally labeled 10. The cell 10 has symmetrical source/drain regions 14 and 16 in connection with a semiconductor well 30. The well 30 and a gate 26 are separated from a charge trapping layer 20 by an oxide region 18. In this configuration, as seen in FIG. 1F, the left side of the charge trapping layer 20 is designated as the "left bit" or Bit-L 34, and the right side as the "right bit" or Bit-R 36.

A limitation with two-bits per cell NVM semiconductor devices is a narrow "window of operation" that exists after the conventional programming of a two-bit cell. The window of operation is generally described as the difference in the threshold voltage (Vt) of a programmed cell bit as compared to the Vt of the un-programmed (erased) state. FIG. 1G illustrates the distribution of the un-programmed Vt of the right bit 36 of FIG. 1H as well as the distribution of the programmed Vt of the right bit 36 of FIG. 1H. As FIG. 1G indicates, the window of operation of 4V in this example is that difference between the highest Vt of the un-programmed state 1 and the lowest Vt of the programmed state 0. As a cell bit is programmed from an un-programmed state (a logic 1) to a programmed state (a logic 0) the threshold voltage increases for that bit. Voltage thresholds and techniques for programming the left and right bits of NVM semiconductors are discussed in U.S. Pat. No. 6,011,725 (Eitan '725), the contents of which is incorporated by reference herein.

The greater the difference in the un-programmed Vt from the programmed Vt allows for a clearer distinction between the programmed and un-programmed cell states for one-bit cells or to describe the state of the right bit and/or the left bit for two-bit cells. A greater difference between Vt of the two bits in a two-bit cell also allows for a clearer discrimination among the four distinct programmed cell states referred to above. Greater differences between the programmed and un-programmed state Vt, in other words a larger operational window, can be accomplished by programming from a lower initial voltage threshold Vti. The lower the Vti, then the greater discrimination that will exist between the un-programmed state and the programmed state. Memory cells with a larger operation window have the advantage of tolerating more charge loss and read disturb and such cells have greater endurance, which refers to the cycling of the program and erase steps.

As indicated in FIG. 1G, the window of operation is also known as the second bit window of operation regarding a two-bit memory cell. The second bit window of operation is generally described as the effect on the Vt of one bit that is not undergoing a programming action by the programming of the other bit associated with the same cell (the target bit). In other words, as seen in FIGS. 2A and 2B, as the left bit is programmed from its initial state with Vti to its programmed state with a programmed Vt, the Vt of the right bit undergoes a "shift" in that although it is not being programmed, the right bit Vt is adjusted higher anyway and thus has a higher Vt for the same bit state that existed before the left bit was programmed. As FIGS. 3A and 3B indicate, the lower the initial Vt (Vti) of both the bit to be programmed (the target bit of the target cell) and the non-programmed bit (non-target bit of the target cell), then the lower Vt shift for the non-programmed bit will be induced as the programmed bit undergoes a larger Vt shift for programming purposes. As seen in FIG. 3A, the erasure method of the present invention provides an erased Vt that is lower than the Vti of the memory cell 10.

When subjected to a conventional erase, program, and read operation the non-targeted NVM cells of the VG array will experience leakage current flow. FIG. 2C illustrates the leakage current flow exhibited by NVM cells of a VG array that are not targeted during a conventional programming step of a target NVM cell or cells.

Programming (i.e. charge injection) in two-bit NVM cells is achieved by various conventional hot carrier injection methods such as channel hot electron injection (CHE), source side injection (SSI) or channel initiated secondary electron (CHISEL).

It is desirable to begin programming of two-bit memory cells in a VG array with a lower initial Vt (Vti) so that there will be a larger widow between the Vt of the programmed state and Vt of the non-programmed state in that there is a smaller Vt shift imposed on the non-programmed bit as the other, target bit, is programmed. It is also desirable to conduct an erase, program, and read operation on a VG array with two-bit NVM cells and limit the leakage current from non-targeted cells in the array.

BRIEF SUMMARY OF THE INVENTION

The present invention relates to non-volatile memory ("NVM") semiconductor devices that implement multiple bit programming, specifically two-bits per cell, and the application of the two-bit NVM cell to a virtual ground (VG) array. Further, this invention relates to a method for reducing the second bit effect on the two-bit NVM cell and thereby increase the window of operation of the two-bit cell.

The method of the present invention, dubbed the "Turn-On-Mode" operation, increases the second bit window of operation of the two-bit cell NVM by lowering the initial voltage threshold (Vti) of both the left and right bits so that the effect of programming one of the left or right bits (the target bit) on the Vt of the non-target bit is lower than if the Vti of both bits was at a higher level.

The first step of the Turn-On-Mode operation is to erase all the two-bit NVM cells in the array via a hole injection erase in which reference voltage is applied to the source/drain regions and the substrate of the memory cells while a positive bias voltage is applied to the NVM cell gate. Holes are thereby injected into the trapping layer of the semiconductor and thereby inducing a channel in the substrate between the two source/drain regions. The trapped hole charge will also lower the Vt of the cell for both the left and right bits. This provides the advantage of turning on the memory cell with a negligible voltage or mere reference voltage applied to the gate.

The second step of the Turn-On-Mode operation is to program the right and then the left bits, or vice versa. Conventional programming methods such as Channel Hot Electron (CHE) programming can be used for this step of the Turn-On-Mode operation. Programming voltages are applied to the target source/drain region or regions via the bit lines disposed parallel on both sides of the targeted NVM cell of the VG array. It is important to note that technically, a programming voltage close to that of a reference voltage can be considered to be a programming voltage in that the bit associated with the source/drain to which it is applied is being written to a logic 1 state. However, as a logic 1 state is generally considered to be an un-programmed state, for purposes of this invention, programming will be considered to be the operation of writing a bit to a logic 0 state. A programming voltage is also applied to the gate or gates of the target NVM cells via the word line associated with the target cell(s). Intermediate word lines have a bias voltage applied to turn off the memory cells associated with the intermediate word lines.

The last step in the Turn-On-Mode operation is the read step wherein the state of the right and left bits of the target memory cell(s) are read to ascertain their state as either programmed or un-programmed. In the cell or cells to be read, read voltages are applied to the source/drain region opposite that source/drain region associated with the bit to be read. In other words, to read the left bit of a cell or cells, a read voltage is applied to the source/drain associated with right bit of the cell. These read voltages are applied via the bit lines to the right and left bit source/drain regions respectively. The gates of the cells to be read have a read voltage applied via the associated word line. The read voltage is a magnitude between the cell's erased Vt and the cell programmed Vt. Intermediate word lines are biased to the extent that the cells associated with the word line are turned off.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 2C is a schematic illustration of the leakage current that occurs in a VG array when a memory cell like the one shown in FIG. 1 is programmed conventionally;

FIG. 9 is a schematic diagram of the two-bit NVM VG array of FIG. 5A demonstrating the "Turn-On-Mode" reading of a first bit (Bit-R or right bit) of particular NVM cells.

DETAILED DESCRIPTION OF THE INVENTION

Figure 1A:
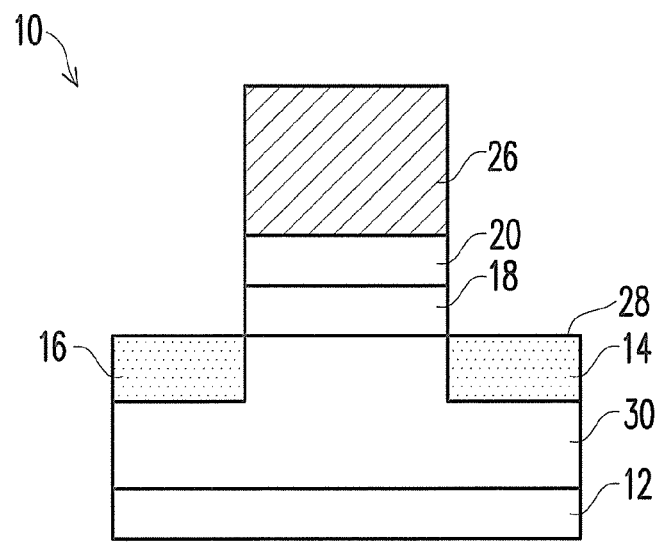
FIG. 1A is a partial sectional side elevation view of a conventional non-volatile memory (NVM) in accordance with the preferred embodiment of the present invention.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the object described and designated parts thereof. Their terminology includes the words above specifically mentioned, derivatives thereof and words of similar import. Additionally, the word "a" and the word "an", as used in the claims and in the corresponding portions of the specification, means "at least one."

As used herein, reference to conductivity will be limited to the embodiment described. However, those skilled in the art know that p-type conductivity can be switched with n-type conductivity and the device would still be functionally correct (i.e., a first or second conductivity type). Therefore, where used herein, the reference to n or p can also mean either n or p and or p and n can be substituted therefore.

Furthermore, n+ and p+ refer to heavily doped n and p regions, respectively; n++ and p++ refer to very heavily doped n and p regions, respectively; n– and p– refer to lightly doped n and p regions, respectively; and n--and p--refer to lightly doped n and p regions, respectively. However, such relative doping terms should not be construed as limiting.

Referring to the drawings in detail, wherein like reference numerals indicate like elements throughout, there is shown in FIGS. 1A-1H and 4-9 a non volatile memory (NVM) cell 10 and array 80, where indicated, in accordance with a preferred embodiment of the present invention.

FIG. 1A is a partial sectional side elevational view of a conventional non-volatile memory (NVM) cell 10 in accordance with the preferred embodiment of the present invention having a well/substrate 12, a first source/drain layer 14, a second source/drain layer 16, an oxide layer 18, and nitride charge trapping layer 20, and a gate layer 26. The NVM cell 10 also has a substrate main surface 28.

The gate layer 26 may be composed of the p-polysilicon doped material as shown or the gate layer may be made from n-doped polysilicon material or it could be a metal. A NVM cell such as 10 will at any given time have a threshold voltage Vt such that the Vt is that voltage, applied to the gate of the cell, at which the NVM cell conducts current from a first source/drain region to the second source/drain region. Programming the right or left bit of an NVM cell from a 1,1 (Bit-L and Bit-R both un-programmed) state to a 0,1 (Bit-L programmed and Bit-R un-programmed) or 1,0 (Bit-L un-programmed and Bit-R programmed) or 0,0 (Bit-L and Bit-R both programmed) state causes the Vt of the NVM to increase.

Figure 1B:
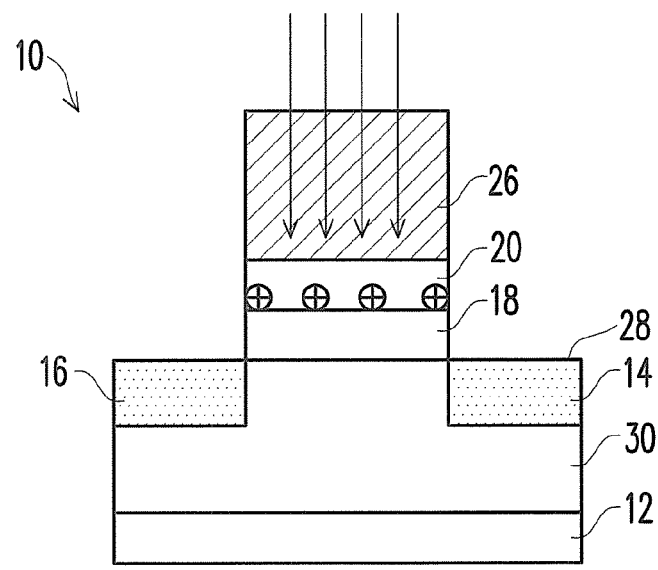
FIG. 1B is a partial sectional side elevation view of FIG. 1A demonstrating an erasing method in accordance with the preferred embodiments of the present invention.

FIG. 1B is a partial sectional side elevation view of the NVM cell 10 of FIG. 1A demonstrating an erasing method in accordance with the preferred embodiments of the present invention. As seen in FIG. 1B, holes can be induced to flow from the gate layer 26 into the nitride layer 20 by application of a gate voltage bias of 14-20 volts direct current and the application of a reference voltage to the first and second source/drain regions and to the well/substrate region. This form of NVM cell erasure, called Hole Injection Erasure, when applied to an initial cell will lower the cell's initial Vt, conventionally referred to as Vti, to a reduced level and likely into a negative region. This reduced Vt, precedent to a bit being programmed, provides for a lower Vt shift from un-programmed state to a programmed state that is desired to lower the second bit effect on the Vt of the un-programmed bit. Further, if this erase method is applied to a previously programmed cell, the same erase method is applied to reduce the voltage threshold, Vt, to generally the same negative region as that of the initial cell.

Figure 3A:
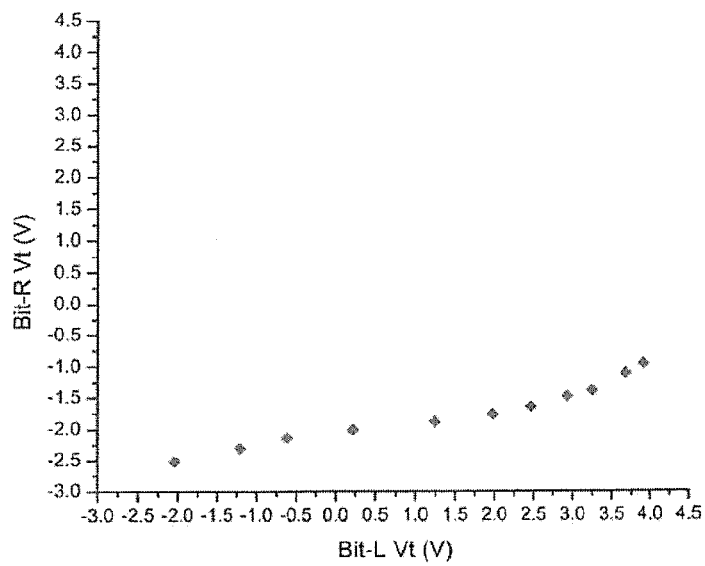
FIG. 3A is a graphical illustration of the resulting voltage threshold of both Bit-R and Bit-L of the NVM of FIG. 1B after the cell is erased in accordance with a preferred embodiment of the invention and after it is programmed with a conventional method.
Figure 3B:
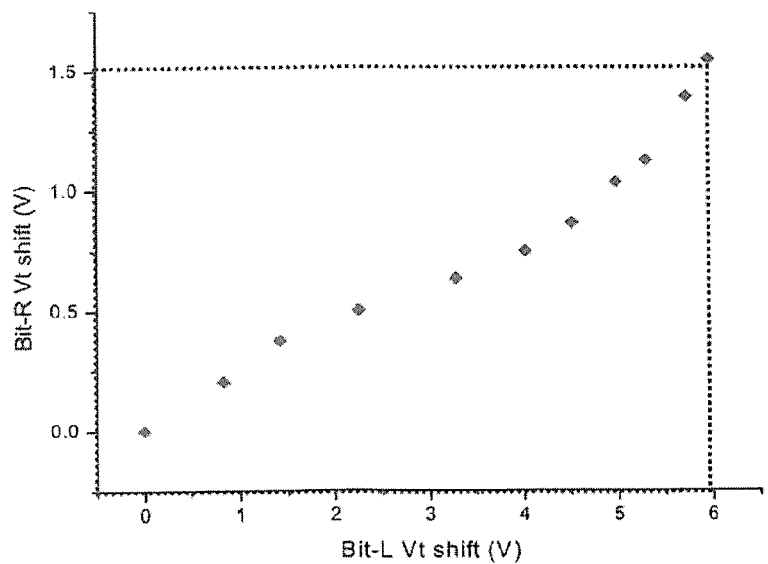
FIG. 3B is a graphical illustration of the resulting Bit-R shift as compared to the Bit-L shift when the NVM of FIG. 1B is erased in accordance with a preferred embodiment of the invention and after it is programmed with a conventional method.

The result of the hole injection erasure on the Vt of the NVM cell 10 can be seen graphically on FIG. 3A. As FIG. 3A shows, the erased Vt of the memory cell will be lower than the initial Vt of the cell (Vti). As seen in FIG. 3B, with a lower Vt, the second bit effect of the programming of the Bit-L 34 on the Vt of Bit-R (the non-target bit) will be nominal. In the example of FIG. 3B, a 6 volt programming shift in the Vt of Bit-L 34 (from –2 volts to 4 volts) results in only a 1.5V non-programming shift in the Vt of Bit-R 36 (from –2.5 volts to –1.0 volts). The difference in the Vt shifts of both bits being a 4.5 volt second bit window of operation.

Figure 1C:
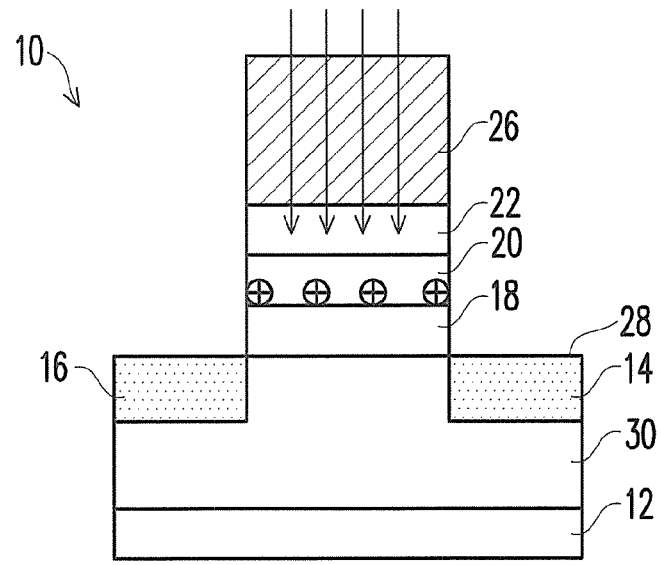
FIG. 1C is a partial sectional side view of an NVM cell of a different configuration demonstrating an erasing method in accordance with the preferred embodiments of the present invention.

FIG. 1C demonstrates the erasing method in accordance with the present invention on a NVM cell 10 with an additional oxide layer 22 located beneath the gate layer 26 and above the nitride trapping layer 20, hence referred to as the top oxide layer. This additional oxide layer 22 is optimum, meaning that the thickness of the layer will allow hole charge tunneling and is less than or equal to 30 Angstroms. Thus, application of a gate bias voltage of 14-20 volts direct current and the application of a reference voltage to the first and second source/drain regions 14 and 16 and the well/substrate region 12 will result in identical erasure of the NVM cell 10 as discussed in reference to FIG. 1B.

Figure 1D:
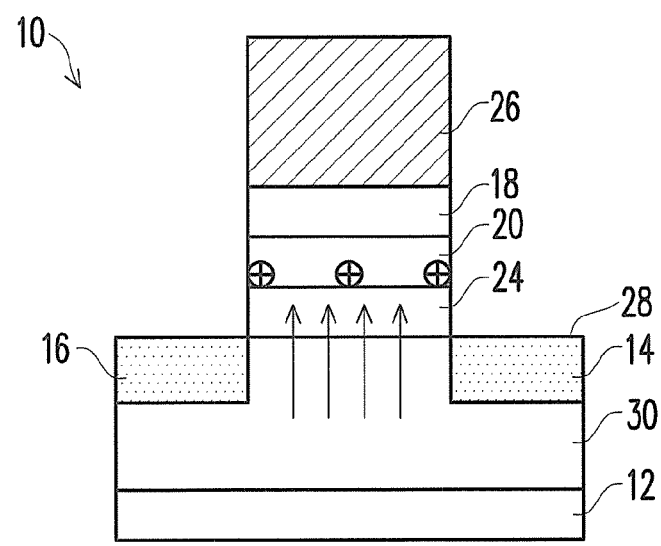
FIG. 1D is a partial sectional side view of an NVM cell of a different configuration demonstrating an erasing method in accordance with the preferred embodiments of the present invention.

FIG. 1D demonstrates the erasing method in accordance with the present invention on an NVM cell 10 with an additional oxide layer 24 located beneath the nitride trapping layer 20 and above the well/substrate region 12, hence referred to as the bottom oxide layer. The first oxide layer 18 is located beneath the gate 26 and above the nitride trapping region 20 in this configuration. This additional oxide layer 24 is optimum and thus, application of a gate bias voltage of –14 to –20 volts direct current and the application of a reference voltage to the first and second source/drain regions 16 and 18 and the well/substrate region 12 will result in identical erasure of the NVM cell 10 as discussed in reference to FIG. 1B, albeit with the holes conducted from the well/substrate region 12 through the bottom oxide layer 24 into the nitride trapping layer 20.

Figure 1E:
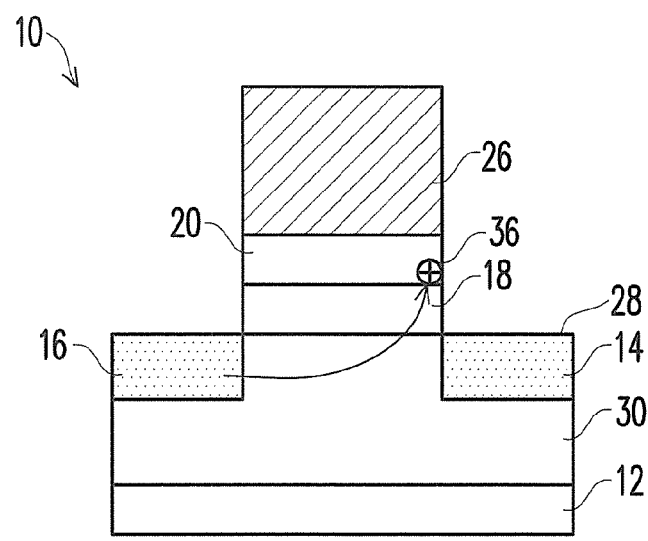
FIG. 1E is a partial sectional side elevation view of a conventional non-volatile memory (NVM) cell of FIG. 1A undergoing conventional channel hot electron (CHE) programming of the right bit (Bit-R) of the cell.

FIG. 1E is a partial sectional side elevation view of a conventional non-volatile memory (NVM) cell 10 undergoing conventional channel hot electron (CHE) programming of the right bit 36 (Bit-R) of the cell. By programming the cell's Bit-R 36, the Vt of the cell's Bit-R 36 increases from the TOM erased Vt to a programmed Vt, a higher Vt, but not has high of a Vt as would occur if the cell had not first been erased to a low Vt, or Vt<Vti, in the step illustrated in FIG. 1B. In other words, without the TOM erase step, the higher the Vt of the programmed target bit (Bit-R), the larger the second bit effect would be on the non-target bit's (Bit-L) Vt.

Figure 1F:
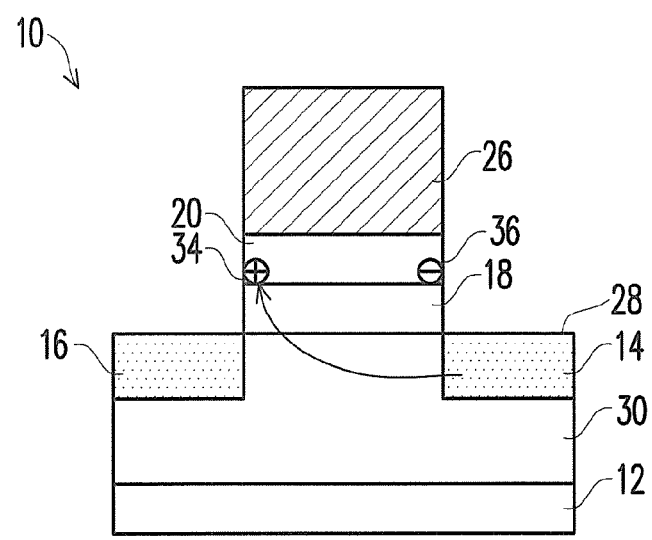
FIG. 1F is a partial sectional side elevation view of a conventional non-volatile memory (NVM) cell of FIG. 1E, with an already programmed right bit (Bit-R), undergoing conventional channel hot electron (CHE) programming of the left bit (Bit-L)
Figure 1G:
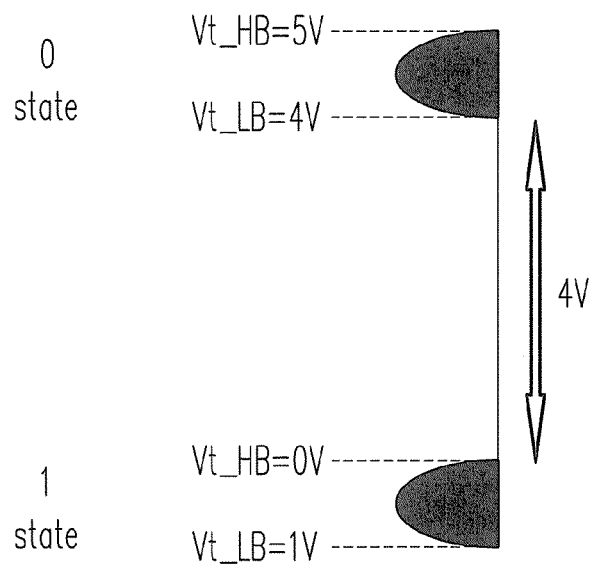
FIG. 1G is an illustration of the second bit window of operation as one bit in a two-bit NMV cell of FIG. 1A transitions from an un-programmed state to a programmed state.
Figure 1H:
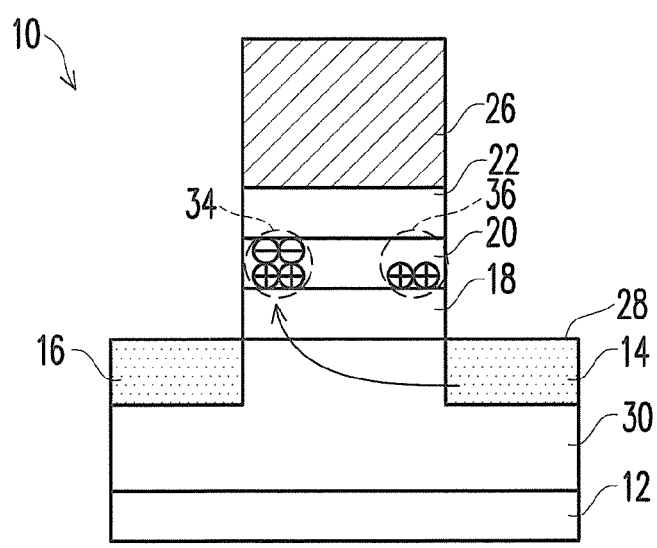
FIG. 1H is a partial sectional side elevation view of a two-bit NVM cell in which the left bit is programmed and the right bit is un-programmed.

FIG. 1F is a partial sectional side elevation view of a conventional non-volatile memory (NVM) cell 10 undergoing conventional channel hot electron (CHE) programming of the left bit 34 (Bit-L) of the cell. By programming the cell's Bit-L 34, the Vt of the cell's Bit-L 34 increases from the TOM erased Vt to a programmed Vt, a higher Vt. A larger second bit effect would occur if the cell had not first been erased to a low Vt, Vt<Vti, in the step illustrated in FIG. 1B.

Figure 4:
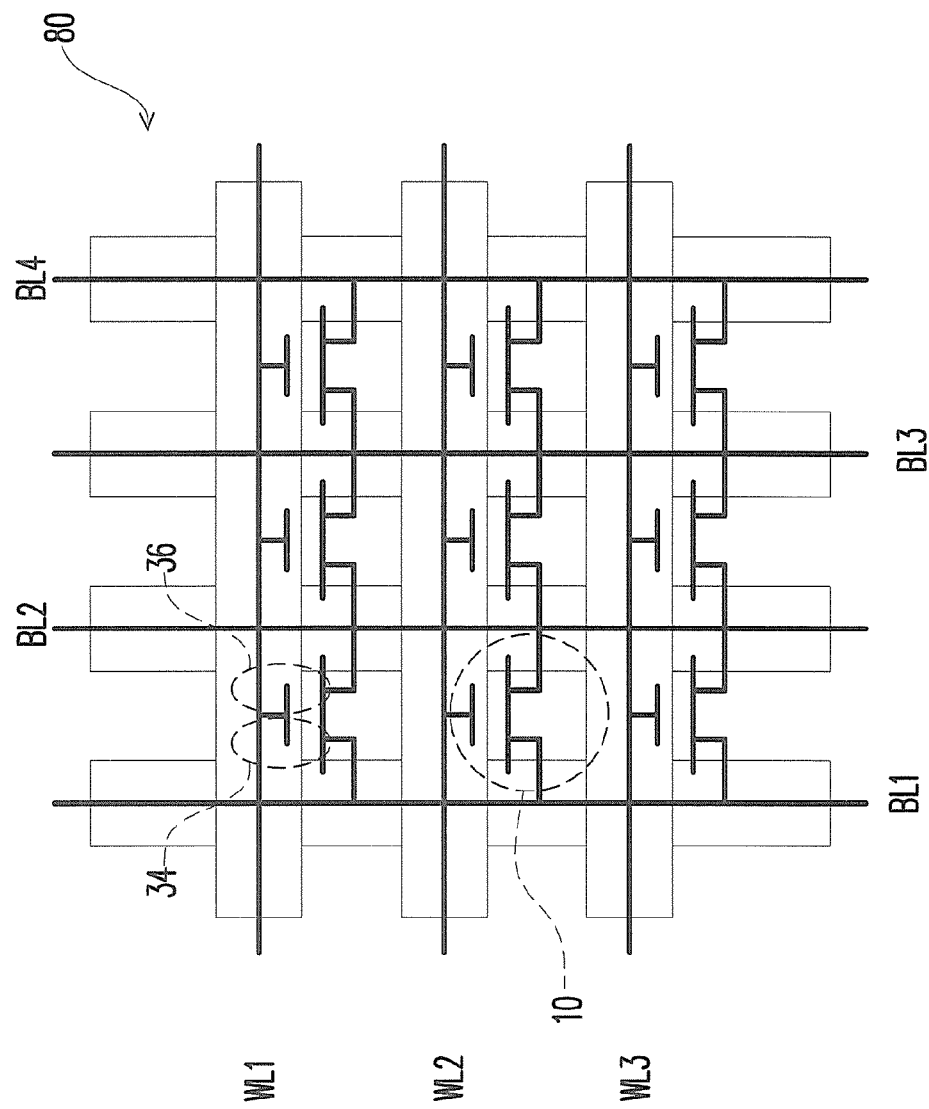
FIG. 4 is a schematic diagram of a VG array having two-bits per cell NVM nitride trap memory like the NVM of FIG. 1.

Typically, NVM cells are employed in great numbers in memory arrays such as a virtual ground (VG) array. FIG. 4 is a schematic diagram of a VG array 80 having two-bits per cell NVM memory 10 (typical). This VG array 80 employs a plurality of word lines WL1-WL3 and bit lines BL1-BL4 in the architecture that allows for the selection of individual two-bit cells 10 (typical) that make up the array 80. Cell selection is made by activating the appropriate bit lines BL1-BL4 associated with the target cell by applying voltage to the bit lines that conduct voltage to the source/drain regions of the two-bit memory cells 10. A word line WL1-WL3 is "turned-on" by applying a voltage to the word line WL1-WL3 that induces the NVM cells 10 associated with the word line to turn on. The respective word lines WL1-WL3 are disposed on top of the NVM cells 10. The bit line BL1-BL4 regions are n-doped.

The VG array of FIG. 4 employs two-bit NVM cells 10 like those of FIG. 1A, 1C, or 1D. In FIG. 4, the array 80 has a semiconductor substrate 12 having a first main surface 28. The NVM array 80 includes a first source drain region 14 and a portion of the semiconductor substrate 12 proximate the first main surface 28, and a second source drain region 16 and a portion of the semiconductor substrate 12 proximate the first main surface 28. The first source drain region 14 is spaced apart from the second source drain region 16. A well region 30 is disposed and a portion of the semiconductor substrate 12 proximate the first main surface 28 between the first source drain region 14 and the second source drain region 16. The NVM array 80 further includes a plurality of memory cells 10 disposed on the first main surface 28 of the substrate 12 above the well region 30 and between the first source drain region 14 and the second source drain region 16. Each memory cell 10 includes an oxide layer 18 formed on the first main surface 28 of the substrate 30, a charged storage layer 20 disposed above at least one oxide layer 18 relative to the first main surface 28 of the semi conductor substrate 30, a plurality of word lines WL1-WL3 that are disposed above the charge storage layer 20 relative to the first main surface 28 and a plurality of bit lines BL1-BL4 disposed parallel on either side of NVM cells 10. The oxide layer 18 is disposed in a portion of the first main surface 28 proximate the well region 30. The bit lines BL1-BL4 are disposed perpendicular to the word lines WL1-WL3. The bit lines BL1-BL4 are in electrical communication with the first and second source drain regions 14, 16 of the plurality of memory cells 10.

The charge storage layer 20 may be formed of a silicon nitride material. Further, referring to FIG. 1D and FIG. 4, the memory cell 10 may comprise a second oxide layer 22 or 24 disposed on the opposite side of the charge storage layer 20 as that of the first oxide layer 18 relative to the main surface 28 of the semiconductor substrate 12. The plurality of word lines WL1-WL3 are disposed above the second oxide layer 22 or 24 relative to the main surface 28 of the semiconductor substrate 12. The word lines WL1-WL3 can be formed from doped poly silicon or metal.

Figure 5A:
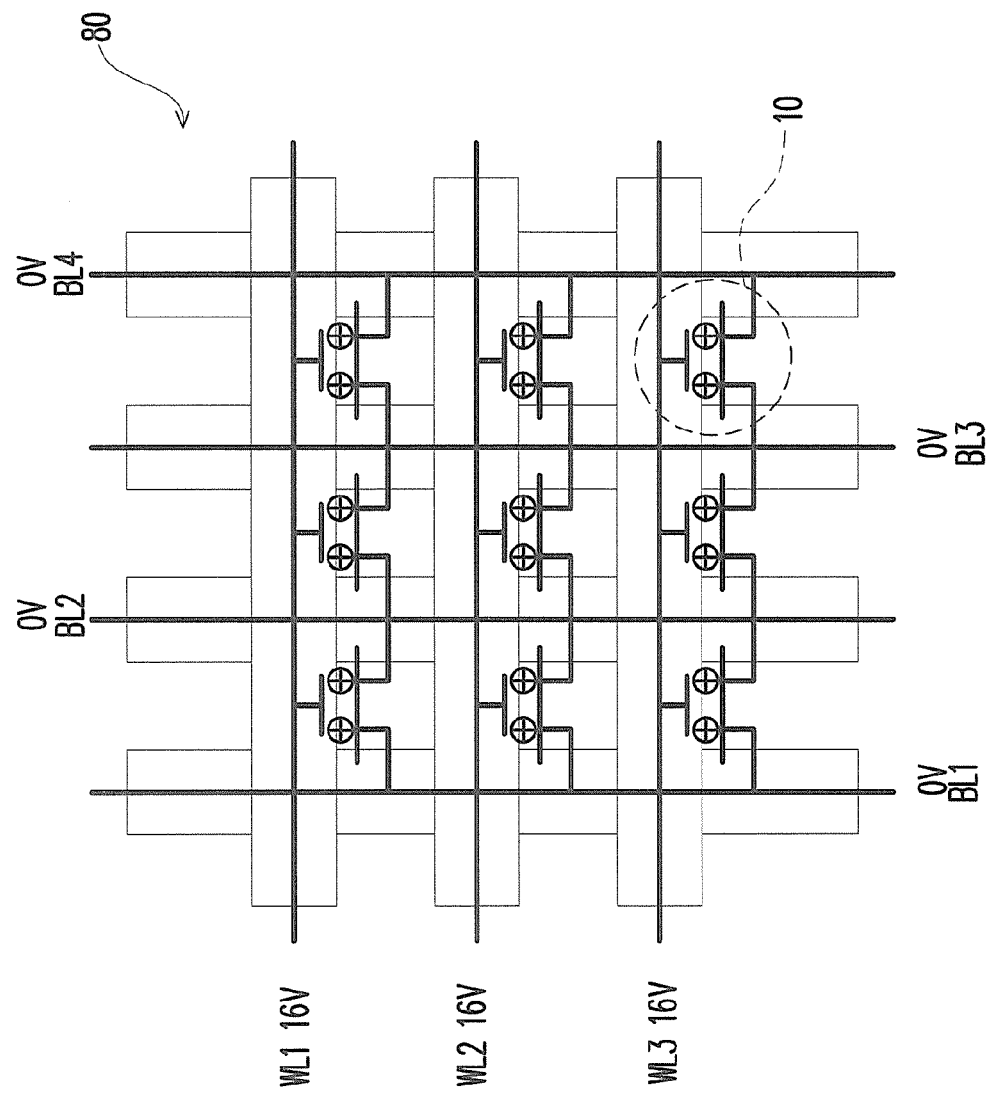
FIG. 5A is a schematic diagram of the two-bit NVM VG array of FIG. 4 demonstrating the "Turn-On-Mode" memory erasure method in accordance with the preferred embodiments of the present invention.

FIG. 5A illustrates a method of erasing non volatile memory cells 10 in a memory array 80. The erasure step is the first step in what is called the "Turn-On-Mode" that incorporates the hole injection erasure of memory cell 10, programming of the bits 34 and 36 of memory cell 10, and then reading the program state of the bits 34 and 36 of memory cell 10. The memory array 80 includes a semiconductor substrate 12, a first source drain 14, a second source drain 16, a well region 30 between the first source drain 14 and the second source drain 16. The memory array 80 further includes a plurality of memory cells 10 disposed on the semiconductor substrate 12 between the first source drain 14 and the second source drain 16. The memory array 80 also includes word lines WL1-WL3 associated with respective memory cells 10 and bit lines BL1-BL4 that are in electrical communication with the first and second source drain regions 14, 16 of memory cells 10. Each memory cell 10 includes at least one oxide layer 18 located above the well region 30 and a charge storage layer 20 located above the oxide layer 18. To erase the memory cells 10 a reference voltage is applied to the well region 30 of the memory cells 10, an erasing voltage is applied to the word lines WL1-WL3 and a reference voltage is applied to the bit lines BL1-BL4.

Figure 5B:
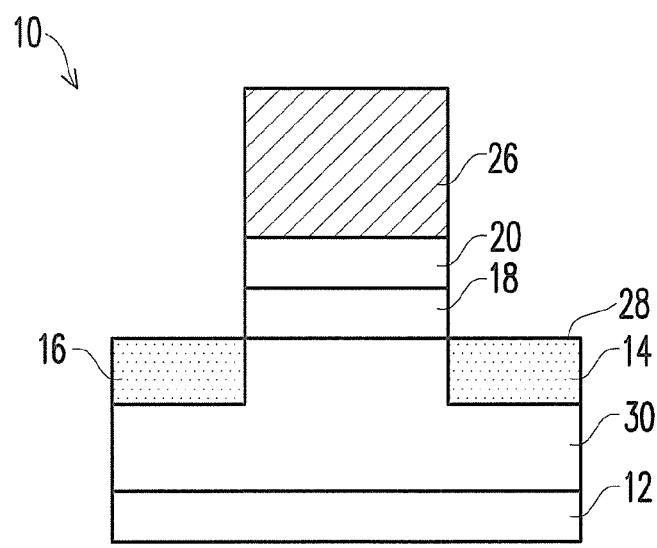
FIG. 5B is a partial sectional side elevation view of a NVM cell like that in FIG. 1, before undergoing hole injection erasure, where the cell is in the "off" state with no gate bias potential applied.
Figure 5C:
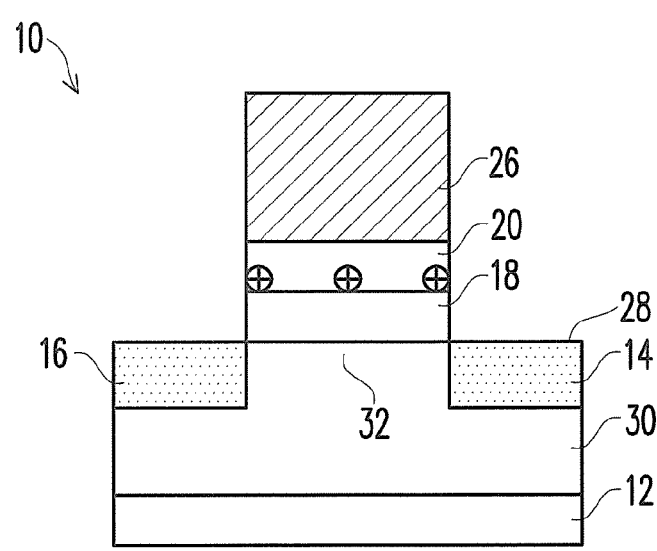
FIG. 5C is a partial sectional side elevation view of a NVM cell like that in FIG. 1, after undergoing hole injection erasure, where the cell is in the "on" state with no gate bias potential applied.

In FIG. 5B, a two-bit NVM cell 10, before the hole injection erase, is in an "off" state while the cell gate 26 is biased with a relatively low or a reference voltage. FIG. 5C shows the cell 10 of FIG. 5B after the two-bit NVM cell 10 has undergone hole injection erase. The two-bit NVM cell after hole injection erase has an induced channel 32 with the same relatively low or reference voltage applied to the gate 26. This induced channel 32 results in the two-bit cell 10 being in the "on" state with no additional bias voltage on the gate 26. After the hole injection erasure, the Vt of the memory cell 10 is lower than the Vti of the memory cell prior to erasure. This imparts the advantage described in relation to FIGS. 3A and 3B in that the second bit effect will be lessened and thereby widen the window of operation.

Referring once again to the VG memory array 80 of FIG. 5A, in a preferred embodiment the erasing voltage applied to word lines WL1-WL3 during the erase method is typically 14-18 volts direct current. In a preferred embodiment the erasing voltage is 14-20 volts direct current.

Figure 6:
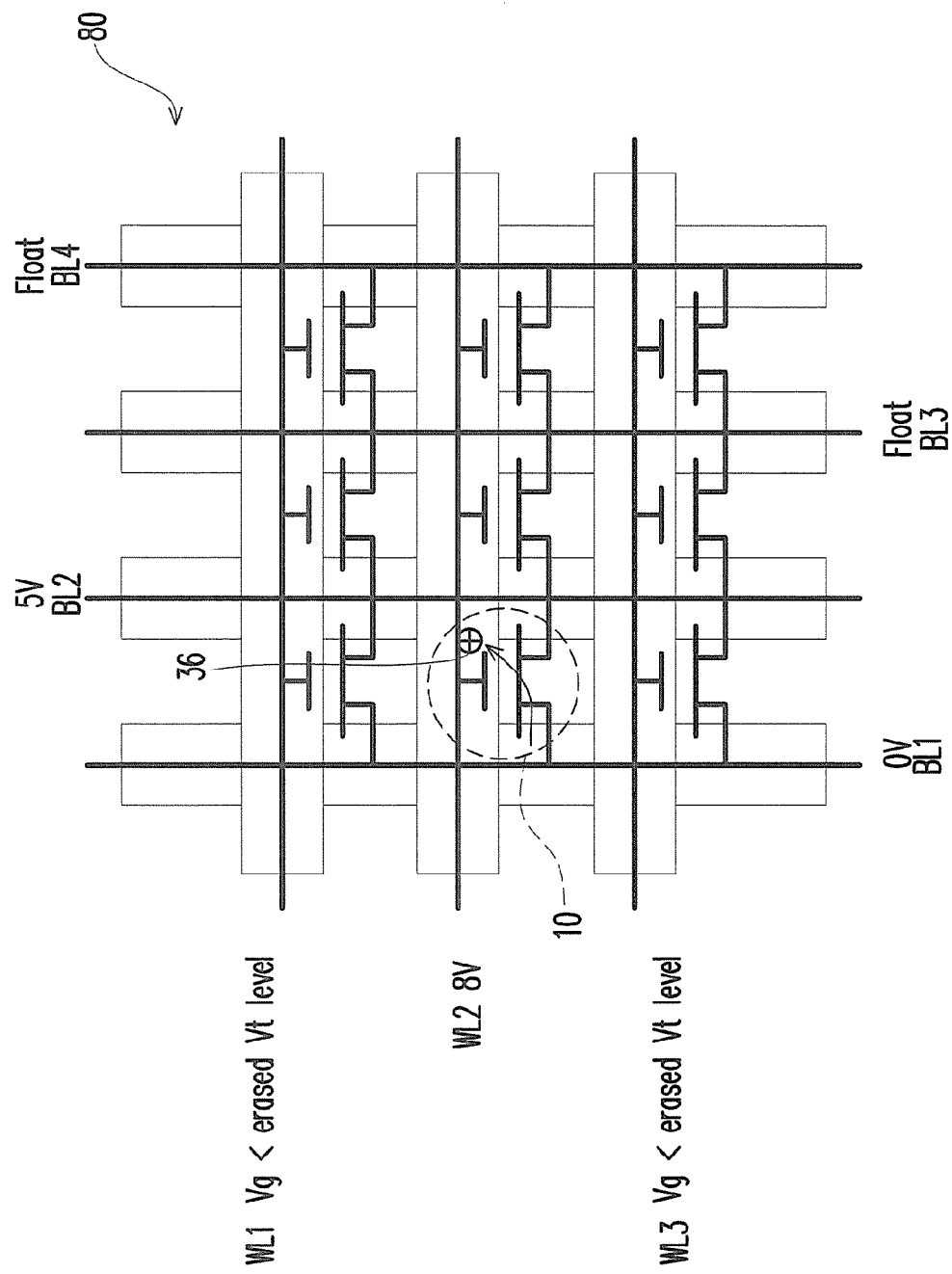
FIG. 6 is a schematic diagram of the two-bit NVM VG array of FIG. 5A demonstrating the "Turn-On-Mode" programming of a first bit (Bit-R) of particular NVM cells.

A method of programming a nonvolatile memory cell 10 in a memory array 80, the second step of the "Turn-On-Mode", is illustrated in FIG. 6. In FIG. 6 the memory array 80 is structured identically to that as described in the erasing method. FIG. 6 demonstrates the programming of the right bit 36 of one memory cell 10 in array 80 to zero state or programmed state. This is accomplished by applying a reference voltage to the well region 30 and further applying a programming voltage to the word line WL2 associated with the memory cell 10 to be programmed. Also a word line deactivation voltage is applied to the word lines WL1 and WL3 in array 80 not associated with the memory cell 10 to be programmed. Further a cell bit programming voltage is applied to the bit line BL2 associated with the selected first or second source drain region 14, 16 of the memory cell 10 to be programmed, here the right bit 36. The cell bit programming voltage must be sufficient to cause electron tunneling from the unselected first or second source drain region 14, 16 through the well region 30 toward the charged storage layer 20 to program a bit associated with the selected first or second source drain region 14, 16, here the right bit 36. Also a reference voltage is applied to the bit line BL1 associated with the non-selected first or second source drain region 14, 16 of the memory cell 10 to be programmed, here the left bit 34. The remaining bit lines BL3-BL4 are left to float.

The programming voltage of the word line WL2 associated with the memory cell 10 to be programmed is typically between 6-10 volts direct current. In a preferred embodiment, the programming voltage is 8 volts direct current. The word line deactivation voltage for the programming method is less than the un-programmed (erased) threshold voltage of the cells 10 associated with the word line that is to be deactivated. In a preferred embodiment the deactivation voltage is −5 volts direct current.

Figure 7:
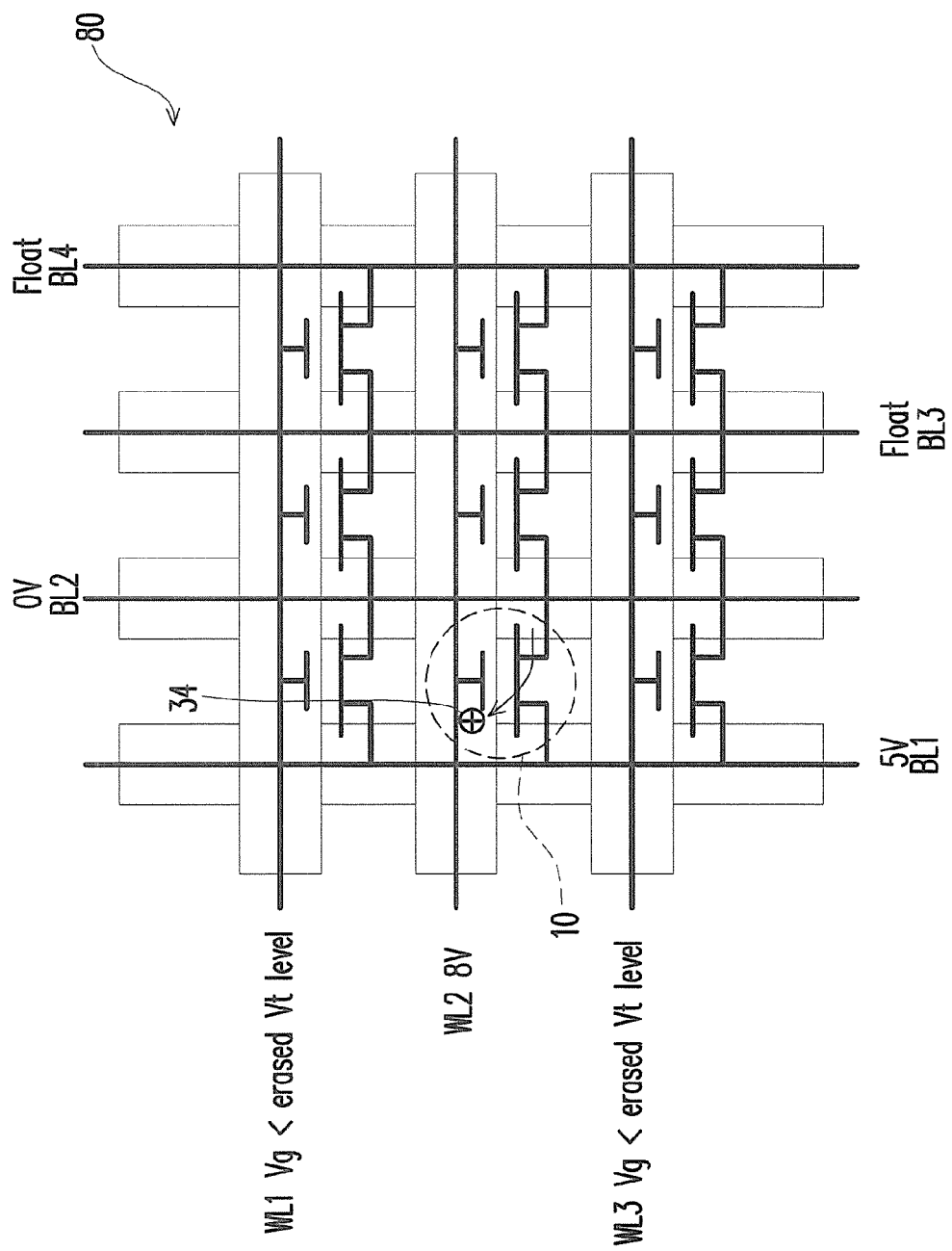
FIG. 7 is a schematic diagram of the two-bit NVM VG array of FIG. 5A demonstrating the "Turn-On-Mode" programming of a second bit (Bit-L) of particular NVM cells.

FIG. 7 illustrates the programming method described in relation to FIG. 6 adapted to program the bit of memory cell 10 that was left un-programmed (or programmed in the "1" state), here the left bit 34. As seen in FIG. 7, the formerly un-programmed bit of the target memory cell 10 is programmed by changing the associated bit line voltage of the first or second source drain region 14, 16 associated with the bit to be programmed, BL1, from a reference voltage to a cell bit programming voltage. The voltage applied to the bit line BL2 associated with the bit that was programmed in FIG. 6 (the right bit 36) is changed from a cell bit programming voltage to a reference voltage. The remainder of the programming step is the same as described with reference to FIG. 6.

Figure 2A:
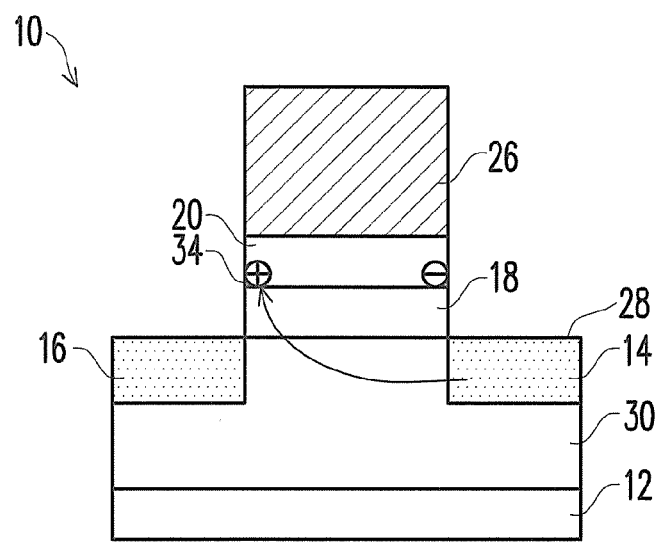
FIG. 2A is a partial sectional side elevation view of the NVM of FIG. 1A demonstrating conventional channel hot electron injection (CHE) programming of the cell's left bit (Bit-L)
Figure 2B:
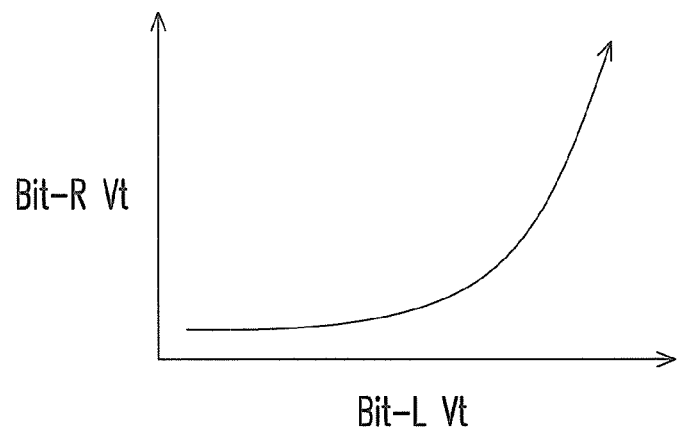
FIG. 2B is a graphical illustration of the second bit effect as demonstrated by the change of the voltage threshold (Vt) of Bit-R while Bit-L is programmed with a conventional programming method.
Figure 2D:
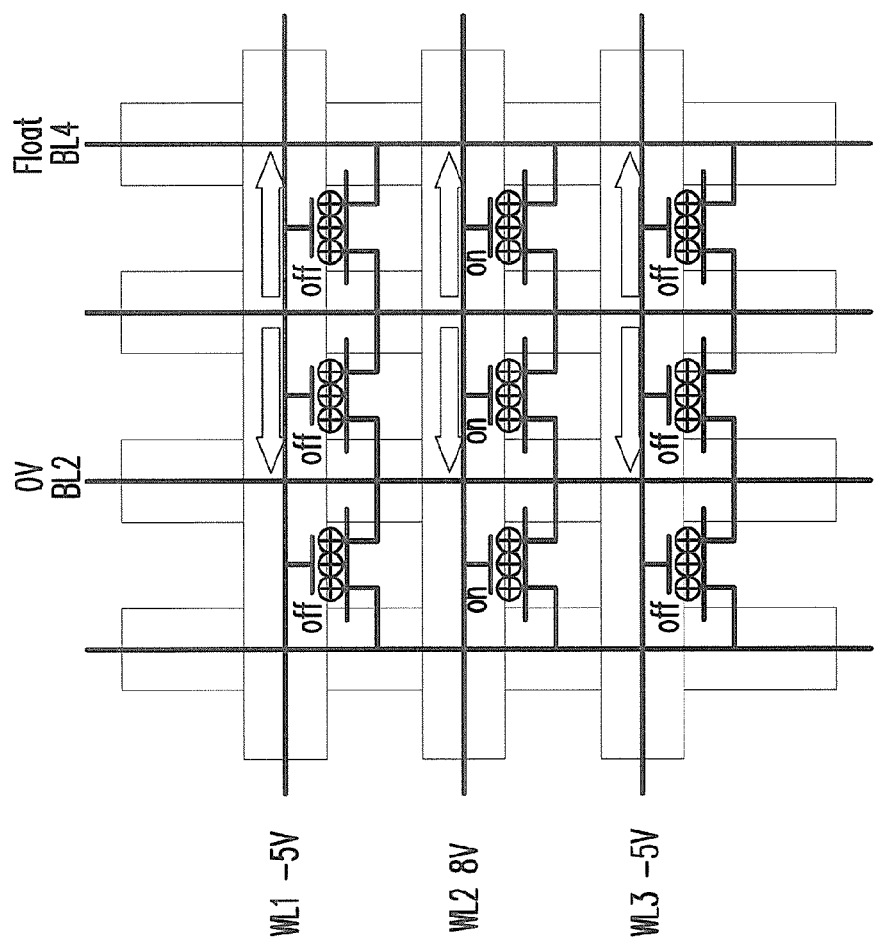
FIG. 2D is a schematic illustration of the impact on leakage current in a VG array when a memory cell like the one shown in FIG. 1 undergoes a programming step in accordance with a preferred embodiment of the invention.

FIG. 2D illustrates the advantage of the TOM of the invention as applied to the VG array 80 with regard to leakage current. As seen in FIG. 2D, with the word lines WL1 and WL3 deactivated with −5 volts direct current applied and with bit lines BL3-BL4 left to float, the leakage current as experienced with the conventional TOM programming step of FIG. 2C is not experienced with the TOM programming step of this invention.

Figure 8:
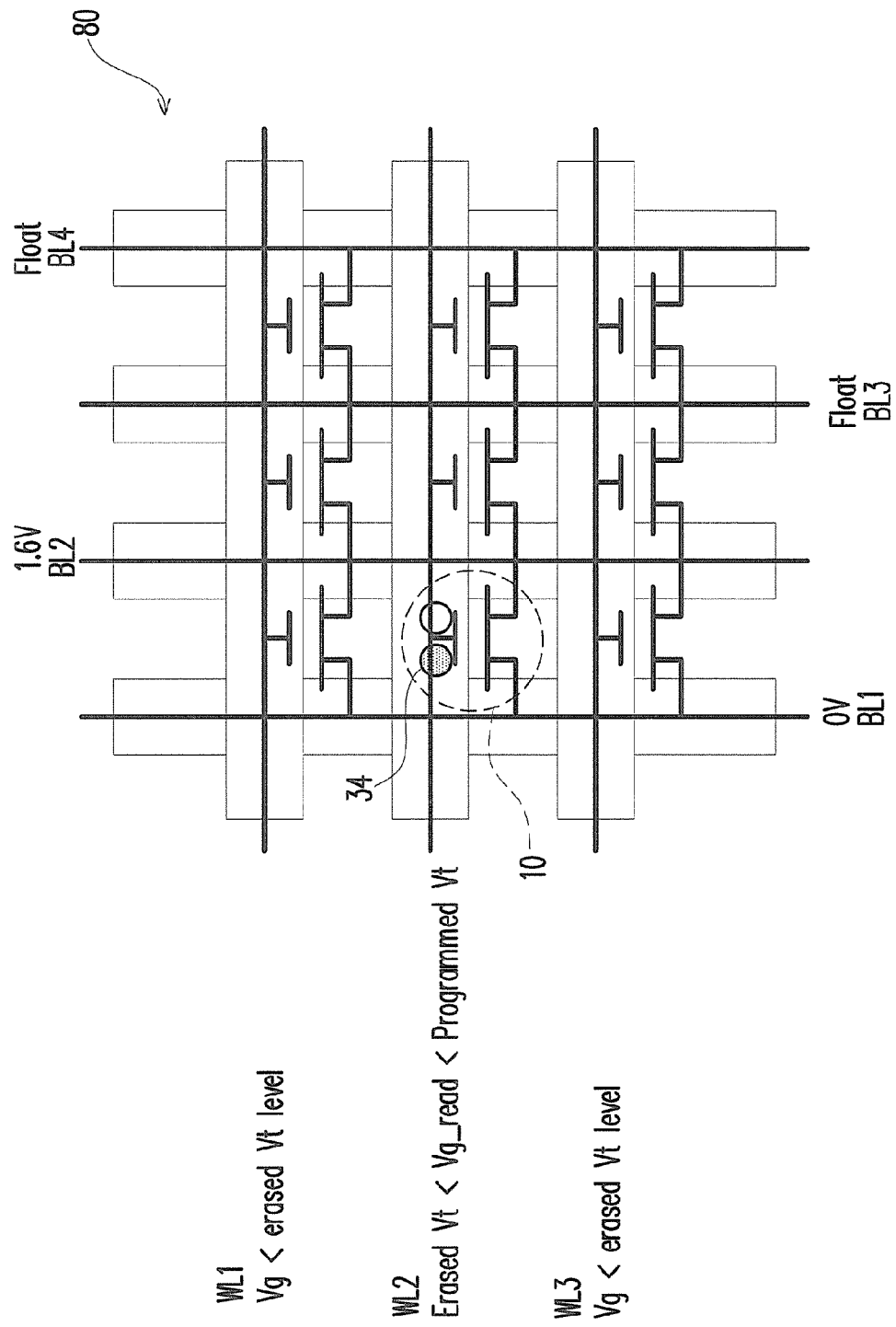
FIG. 8 is a schematic diagram of the two-bit NVM VG array of FIG. 5A demonstrating the "Turn-On-Mode" reading of a second bit (Bit-L or left bit) of particular NVM cells.

FIG. 8 illustrates the method of reading the left bit 34 (bit-L) of memory cells 10 in memory array 80, the last step of the "Turn-On-Mode" operation. Both the memory cell 10 and memory array 80 are structured as described in association with the erasing method and the programming method. Bit-L 34 is read by applying a reference voltage to the well region 30 of memory cells 10 to be read. Further, a read voltage is applied to the word line WL2 associated with the memory cells 10 to be read and a word line deactivation voltage is applied to the word lines WL1 and WL3 not associated with the memory cell 10 to be read. Additionally, a cell bit read voltage is applied to the bit line BL2 associated with the non-selected first or second source drain regions 14, 16 of the memory cells 10 to be read, here the source/drain region associated with the right bit 36. Also, a reference voltage is applied to the BL1 associated with the selected first or second source drain regions 14, 16 of memory cell 10 to be read, here the source/drain region of the left bit 34. The remaining bit lines BL3-BL4 are left to float. This TOM read process also reduces leakage current.

The read voltage applied to the word line WL2 in order to read the memory cells 10 associated with that word line WL2 is between the erased threshold voltage level (Vt) and the programmed voltage threshold (Vt) of the memory cells 10 associated with word line WL2. The word line deactivation voltage applied to the word lines WL1 and WL3 not associated with memory cells 10 to be read is less than the erased voltage threshold (Vt) state. The cell bit read voltage of the reading method described above is typically between 1-3 volts direct current. In a preferred embodiment the cell bit read voltage is 1.6 volts direct current.

FIG. 9 illustrates the reading method described in association with FIG. 8 applied in a manner to read the right bit 36 (bit-R) of memory cells 10 of the VG memory array 80. Similar to the procedure to read Bit-L 34 discussed in relation to FIG. 8, to read Bit-R 36 of memory cells 10 associated with the selected word line WL2, the cell bit read voltage is applied to the bit lines BL1 associated with the non-selected first or second source drain regions 14, 16 of memory cell 10 to be read, here the source/drain region associated with the left bit 34. Also, a reference voltage is applied to the BL2 associated with the selected first or second source drain regions 14, 16 of memory cell 10 to be read, here the source/drain region of the right bit 36. The rest of the reading operation is the same as described with reference to FIG. 8, the reading of the Bit-L 34.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method of erasing a non-volatile memory cell array having a virtual ground array architecture, comprising;
   applying a hole injection positive voltage to a gate of a selected memory cell through a word line and grounding a source and a drain of the selected memory cell through bit lines to lower an initial threshold voltage of a charge storage layer of the selected memory cell.

* * * * *